United States Patent [19]
Raza et al.

[11] Patent Number: 5,635,856
[45] Date of Patent: Jun. 3, 1997

[54] HIGH SPEED PROGRAMMABLE MACROCELL WITH COMBINED PATH FOR STORAGE AND COMBINATORIAL MODES

[75] Inventors: S. Babar Raza, Sunnyvale; Donald Krall, Cupertino, both of Calif.

[73] Assignee: Cypress Semiconductor Corporation, San Jose, Calif.

[21] Appl. No.: 538,519

[22] Filed: Oct. 3, 1995

[51] Int. Cl.$^6$ .................................................. H03K 19/177
[52] U.S. Cl. .................................................. 326/38; 326/44
[58] Field of Search .................................. 326/38–41, 44, 326/93

[56] References Cited

U.S. PATENT DOCUMENTS

| | | | |
|---|---|---|---|
| 4,912,342 | 3/1990 | Wong et al. | 326/41 X |
| 5,019,736 | 5/1991 | Furtek | 326/41 |
| 5,191,243 | 3/1993 | Shen et al. | 326/93 X |
| 5,231,312 | 7/1993 | Gongwer et al. | 326/41 X |

*Primary Examiner*—David R. Hudspeth
*Attorney, Agent, or Firm*—Barnes, Kisselle, Raisch, Choate, Whittemore & Hulbert P.C.

[57] ABSTRACT

A high-speed programmable macrocell includes structure sufficient to implement a combined in the combinatorial storage signal path when the macrocell is operated in the combinatorial, and storage modes of operation. The macrocell includes, a master circuit (including a polarity multiplexer), and a slave circuit (including a transmission gate). The polarity multiplexer is responsive to input data for generating an output signal corresponding to one of a true and complemented state of the input data, according to a polarity configuration bit. The master circuit stores the multiplexer output in response to a low-to-high transition of a clock signal when operating in the storage mode. The master circuit, when in the combinatorial mode, will always pass the multiplexer output therethrough. The transmission gate is coupled to the master circuit and, in the storage mode, will block the output of the master circuit from passage therethrough when the clock is low, but will pass such output therethrough when the clock is high. The transmission gate will always pass the master circuit output when operating in the combinatorial mode. The slave circuit generates output data having true and complemented states in both the storage and combinatorial modes. When in the combinatorial mode, the slave circuit, which, in addition to the transmission gate includes an inverter and a tristate buffer connected in a feedback arrangement, stores and outputs data when the clock is low, based on the data provided to it when the clock is high.

30 Claims, 6 Drawing Sheets

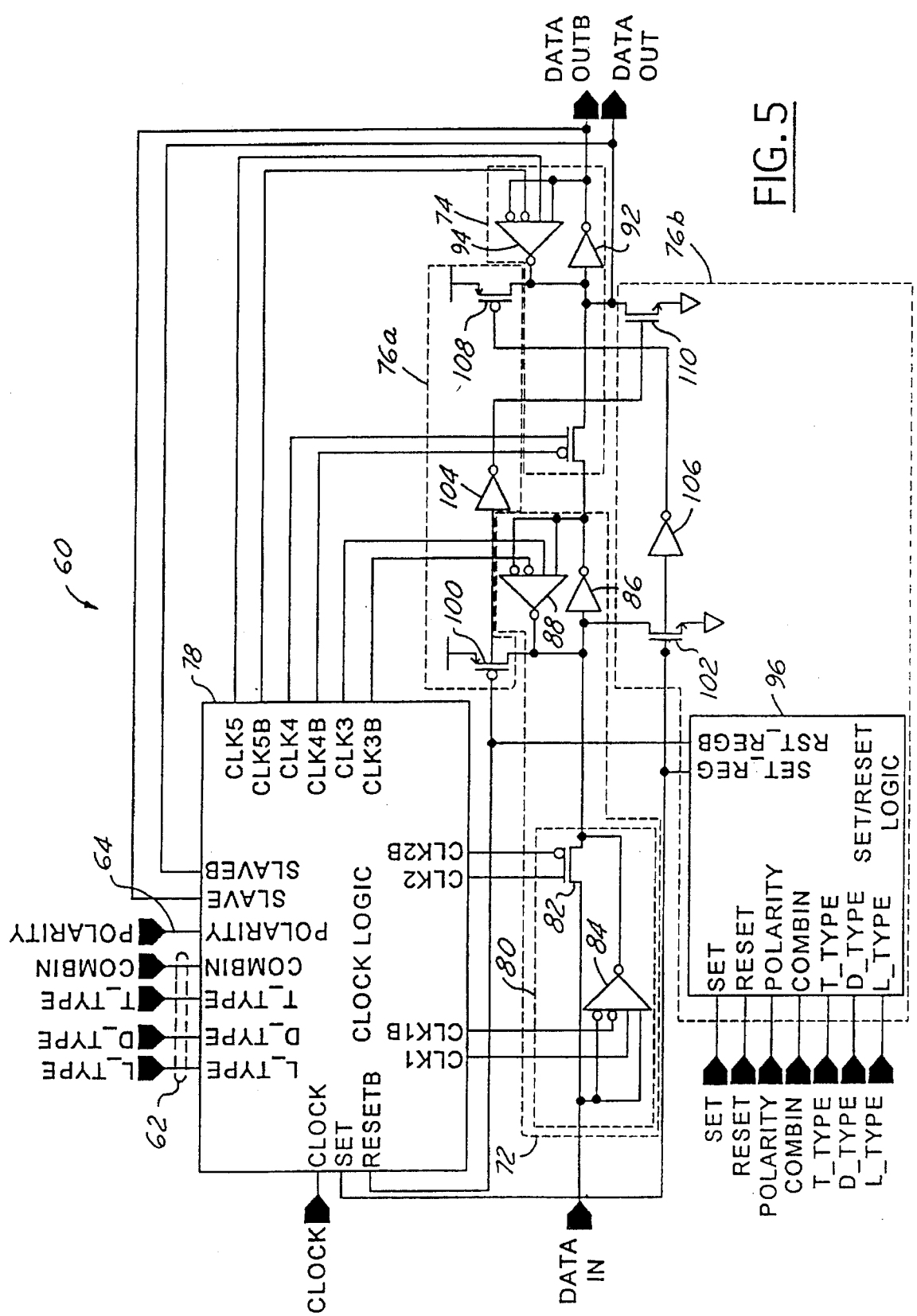

HIGH SPEED PROGRAMMABLE MACROCELL WITH COMBINED PATH FOR STORAGE AND COMBINATORIAL MODES

BACKGROUND OF THE INVENTION

1. Field of the Invention

The present invention relates generally to a high-speed programmable macrocell, and, more particularly, to such a macrocell having a combined signal path for storage and combinatorial modes.

2. Description of the Related Art

A programmable logic device (PLD) provides an economical and efficient means for implementing predetermined Boolean logic functions. Such a device consists of, generally, a group of programmable AND gates responsive to a plurality of inputs to generate predetermined product terms, a group of fixed/programmable OR gates responsive to the product terms for generating a plurality of sum-of-product (SOP) terms, and a macrocell responsive to the sum-of-product terms for generating a desired output. Sum-of-products terms can also be generated using programmable NOR-NOR logic.

In particular, such macrocell may be programmed to operate in a combinatorial mode, where its output follows its input, delayed by the propagation delay of the macrocell. The macrocell may be further programmed to operate in a storage mode, where its output is a function of a clock signal (i.e., the macrocell output is synchronous with the clock signal). Moreover, other features available in connection with the operation of the macrocell, and which may be programmable, include the output polarity of the macrocell (i.e., whether the output is active high, or active low). The macrocell may be programmed to operate in the combinatorial mode or the storage mode, the storage mode including a latch mode, and a registered mode. In the registered mode, the macrocell may be programmed to operate as a D-type flip-flop, or, a T-type flip-flop.

Referring now to FIG. 1, one approach in the prior art in the design of a macrocell for use in a programmable logic device is shown particularly as macrocell 10. Macrocell 10 includes functionality configuration 12, polarity configuration 14, a storage circuit 16, an inverter 18, a polarity multiplexer 20, an inverter 22, and a polarity multiplexer 24. Components 16, 18, and 20 define a storage path for input data to the output of macrocell 10, while components 22, and 24 define a combinatorial path through macrocell 10. Functionality configuration 12 includes such parameters as whether macrocell 10 operates in a combinatorial mode, in a registered mode (i.e., as a D-type, or a T-type flip-flop) or a latch during operation. Polarity configuration 14 determines whether the output of macrocell 10 will assume an active-high polarity, or an active-low polarity. Configuration blocks 12, and 14 may take the form of a bit value for each parameter.

FIG. 2 shows the conventional macrocell 10 of FIG. 1 in greater detail. The storage path referred to above includes the following components, whose operation will be described below: polarity multiplexer 20 (shown enclosed by a dashed-line box), a first OR-AND-INVERT complex gate 26, inverter 28, transmission gate 30, transmission gate 32, a second OR-AND-INVERT complex gate 34, inverter 36, and transmission gate 38. Polarity multiplexer 20 includes transmission gate 39, and tristate inverting buffer 40. A master circuit is formed by multiplexer 20, and components 26, 28, and 30. A slave circuit is formed by components 32, 34, 36, and 38. The output portion of the storage path is defined by tristate inverting buffers 42, 44, 46, and 48.

The combinatorial path is defined by inverters 22a and 22b, and polarity multiplexer 24a, and polarity multiplexer 24b. Multiplexer portions 24a and 24b, together, form polarity multiplexer 24, as shown in FIG. 1. Polarity multiplexer 24a includes tristate inverting buffers 50 and 52, while multiplexer 24b includes tristate inverting buffers 54, and 56. Logic 57 ensures that buffers 50, 52, 54, and 56 operate only the combinatorial mode. The tristate inverting buffers may take the simplified form as shown in FIG. 3, which includes a pair of PMOS transistors 58, and a pair of NMOS transistors 59 connected in series, with the middle node being the output. Operation of the tristate inverting buffer should be apparent to one of ordinary skill in the art from the foregoing description, accompanied by FIG. 3.

During operation, it should be observed that two output signals, data_out, and data_outb (i.e. b=bar, or complement), are used in macrocell 10 in order to drive an output buffer coupled to macrocell 10. Polarity configuration bit 14 is used to select the desired output polarity of macrocell 10. Inverters 22a, and 22b are used to generate an opposite phase of the input data_in. With the combinatorial input bit set so as to select the combinatorial mode, one of tristate inverters 50, and 52, and one of tristate inverters 54, and 56 are conducting, while tristate inverters 42, 44, 46, and 48 are not conducting, and are thus in a high-impedance state.

When macrocell 10 is set to operate in the storage mode of operation, particularly the registered mode, tristate buffers 50, 52, 54, and 56 are always nonconducting. Polarity multiplexer 20 (part of the master circuit) for the registered path is implemented separately from the polarity multiplexer for the combinatorial path, which uses transmission gate 39, and tristate buffer 40. When an input clock signal is in a low state, only one of gates 39 and 40 will conduct, depending on the selected output polarity. At this time (when clock is low) gates 44, 38, and 46 will conduct while gates 42, 30, 32, and 48 will not conduct. Gate 29 is also off.

When the input clock signal transitions to a high state, gates 44, the previously conducting one of gates 39 and 40, 38 and 46 will not conduct, while gates 42, 30, 32, and 48 will conduct. Input data held in the master circuit is stored in the slave circuit and now appear as data_out, and data_outb. The set and reset functions of macrocell 10 are implemented using OR-AND-INVERT complex gates 26, and 34 and set/reset logic. The complex gates operate as follows: when either of the in, or set inputs of the OR-AND-INVERT gate are high, and reset (to the macrocell 10) is low, the outb of the gate is low. When the reset signal is high, the outb output of the gate is high.

One major disadvantage of the conventional macrocell 10 is the large area used by the macrocell, due in large part to the use of separate output polarity muxes for each of the storage, and combinatorial paths, and further, due to the large number of tristate inverting buffers. Moreover, macrocell 10 suffers from a speed penalty for the $T_{co}$ (clock-to-part-to-output delay), and $T_{pd}$ (propagation delay in combinatorial mode) parameters because of self loading on the data_out and data_outb nodes. Moreover, the so-called set-up time $T_s$ parameter for the registered mode suffers due to the set-reset complex gates used for performing the set-reset functions. Finally, the conventional macrocell 10 also has a potential speed penalty for the $T_{pd}$, and $T_s$ parameters because of loading on the data_in node.

Accordingly, there is a need to provide an improved macrocell structure for use in programmable logic devices (PLDs) that minimizes or eliminates one or more of the problems as set forth above.

SUMMARY OF THE INVENTION

It is an object of the present invention to provide a macrocell that provides improved speed, and occupies a reduced area compared to prior art macrocells. To achieve this and other objects, and in accordance with the present invention, a macrocell for use in a programmable logic device is provided and which includes three portions: a polarity multiplexer, a storage circuit, and a combinatorial circuit. The polarity multiplexer is responsive to a polarity multiplex signal, preferably a polarity bit, for changing an output polarity of the macrocell between an active high mode and an active low mode. The storage circuit is coupled to the polarity multiplexer for transmitting input data in accordance with a clock signal when the macrocell is in a storage mode of operation. A combinatorial circuit is also coupled to the polarity multiplexer and is provided for transmitting the input data when the macrocell is in a combinatorial mode of operation. Importantly, the storage circuit and the combinatorial circuit share predetermined components.

In a preferred embodiment, the macrocell includes a master circuit, a slave circuit, and a polarity multiplexer, which is part of the master circuit. The master circuit has an input coupled to input data for passing data when in a combinatorial mode, and for selectively passing data when in a storage mode. The slave circuit includes transmission means connected to the master circuit for selectively blocking an output of the master circuit according to a first state (preferably low) of a clock signal when the macrocell is in the storage mode. The transmission means of the slave circuit is also provided for passing the master circuit output when in the combinatorial mode. Preferably, the transmission means is a transmission gate.

The slave circuit further includes means responsive to the transmission gate output for generating output data having true and complemented states in the storage and combinatorial mode. This structure is also provided for storing data when the clock is low and the macrocell is in the storage mode.

Finally, the polarity multiplexer is coupled to either one of the master circuit or the slave circuit and is provided for varying an output polarity between active high and active low modes according to an output polarity signal. Although the polarity multiplexer is made a part of (i.e., integrated with) the master circuit in the preferred embodiment, it may also be completely separate from both master and slave circuits, and connected to either one to accomplish its designated function. By combining the combinatorial path, and the registered path by sharing components, the area occupied by the macrocell is dramatically reduced (up to 40%), while the operating speed of the macrocell is significantly increased. In an alternate embodiment, the transmission means includes a tristate inverting buffer to provide additional buffering for the output of the macrocell.

In another aspect of the present invention, a method of operating a macrocell for use in a programmable logic device is provided, and is comprised of four basic steps. The first step involves defining a combinatorial signal path through a first structure of the macrocell. The next step involves defining a storage signal path through a second structure of the macrocell wherein the first structure and the second structure share components. The next step includes selecting one of the combinatorial mode and storage modes of operation of the macrocell. Finally, the last step involves operating the macrocell such that an input data signal traverses one of the combinatorial signal path and storage signal path according to the mode of operation selected in the previous step in order to generate an output data signal.

In another embodiment, the polarity multiplexer is common between the storage path, and the combinatorial path, but, the embodiment further includes a bypass structure for use in the combinatorial mode in order to provide improved speed in the combinatorial mode. In a still further embodiment, each of the combinatorial paths, and the storage paths includes a respective polarity multiplexer, and an internal signal path, but both paths share a common output driver.

Other objects, features and advantages of the present invention will become apparent to one skilled in the art from the following detailed description and the accompanying drawings illustrating features of this invention by way of example, but not by way of a limitation.

BRIEF DESCRIPTION OF THE DRAWINGS

FIG. 5 is a simplified combined schematic and block diagram view showing in greater detail a preferred embodiment of the present invention.

DETAILED DESCRIPTION OF THE PREFERRED EMBODIMENTS

Figure 1:
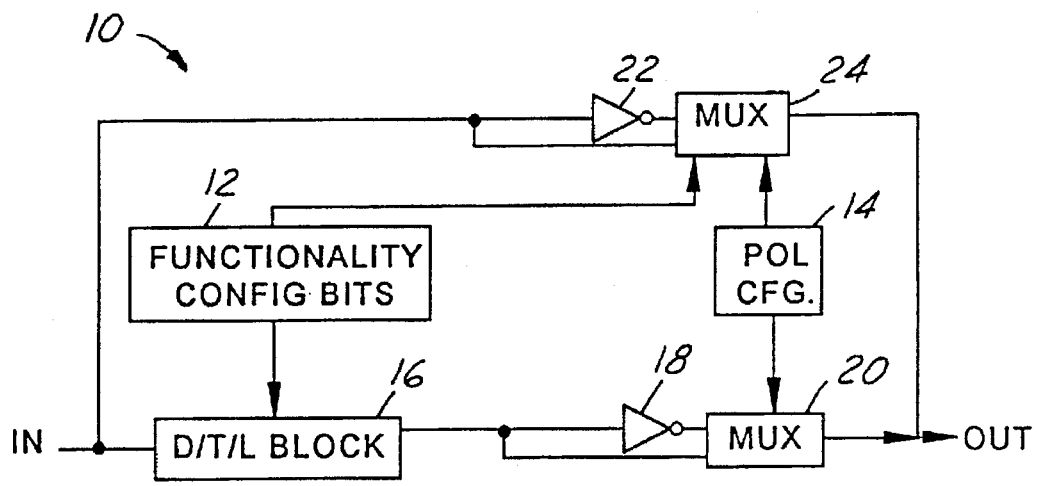
FIG. 1 is a simplified block diagram view of a conventional macrocell having separate registered, and combinatorial paths.
Figure 3:
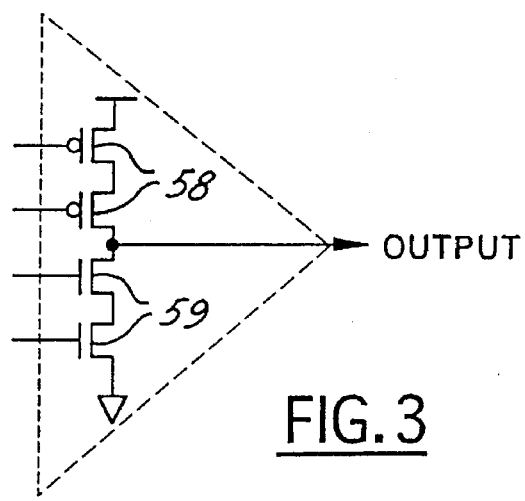
FIG. 3 is a simplified schematic diagram view of a tristate inverting buffer used in the present invention.
Figure 4:
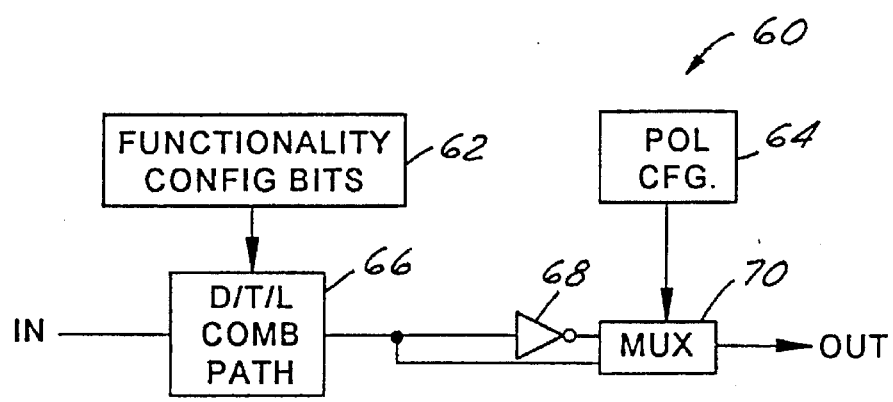
FIG. 4 is a simplified block diagram of a macrocell embodiment in accordance with the present invention.
Figure 2:
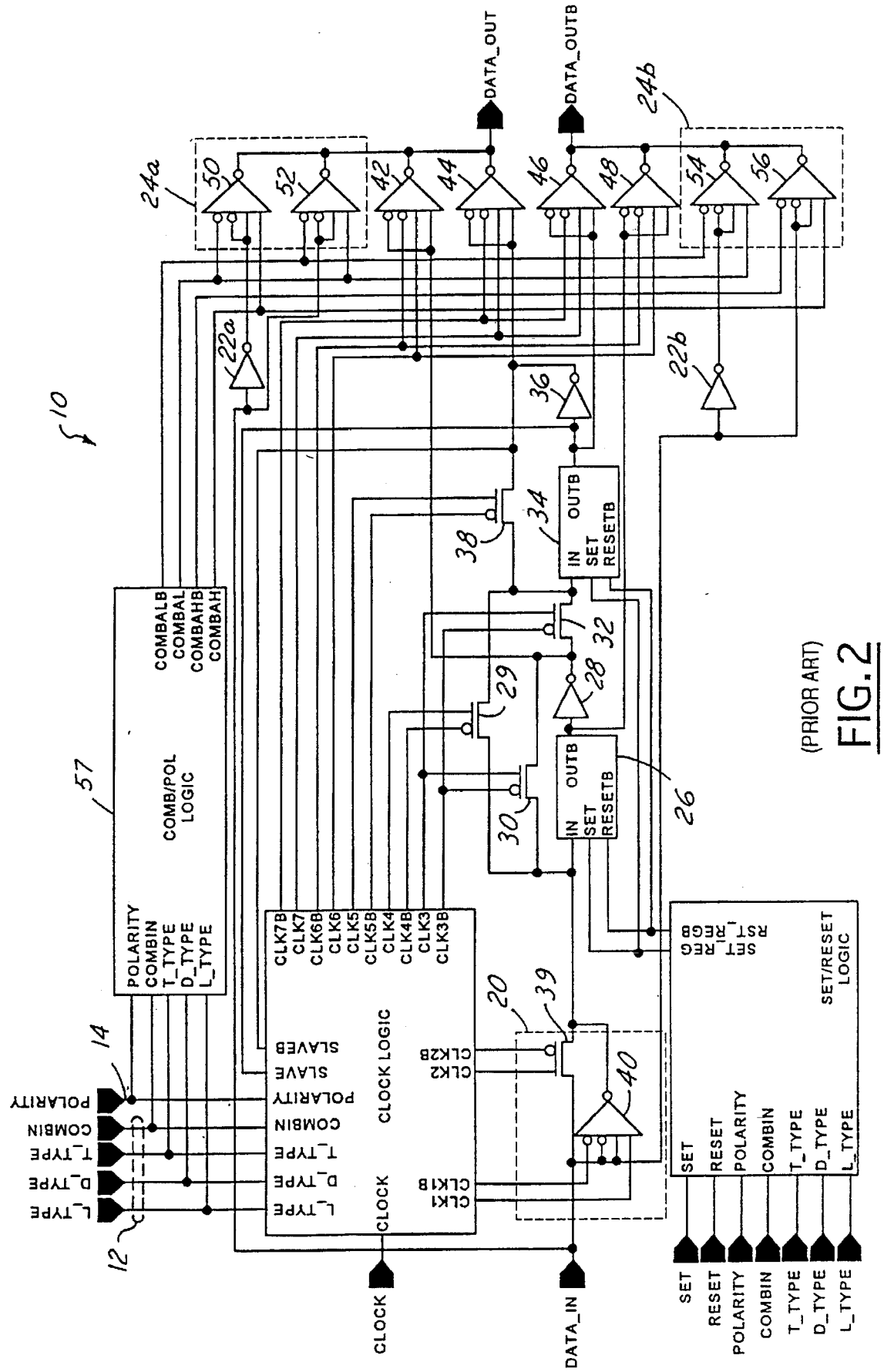
FIG. 2 is a simplified combined schematic and block diagram view showing in greater detail one embodiment of the macrocell of FIG. 1.

Referring now to the drawings wherein like reference numerals are used to identify identical components in the various views, FIG. 4 shows a macrocell 60 in accordance with the present invention. Macrocell 60 may be suitably employed in a PLD or Field Programmable Gate Array (FPGA). Macrocell 60 is one embodiment and includes a functionality configuration block 2, which may be in the form of configuration bits, a polarity configuration block 64, which may be in the form of a polarity configuration bit, a combined storage-combinatorial path 66, an inverter 68, and a polarity multiplexer 70. An embodiment in accordance with the present invention defines a combinatorial signal path through a first structure of the macrocell, and further defines a storage signal path through a second structure of the macrocell wherein the first structure and the second structure share components. This shared structure is shown as block 66.

Before proceeding to a detailed description of the present invention, an overview of the advance established by this invention will be set forth. To operate macrocell 60, an input polarity configuration is selected and applied to polarity multiplexer 70 to select one of an active high, or an active low output polarity. Further, one of the combinatorial mode and the storage mode of operation of the macrocell 60 is selected. The macrocell 60 is then operated such that an input signal traverses one of the combinatorial signal path and the storage signal path according to the mode of operation previously selected in order to generate an output data signal. It should be appreciated that the polarity mux 70 may come before block 66, as well as after (as shown), and further, that inverter 68 may be integrated into block 66, instead of being separate (as shown). The block diagram of FIG. 4 is provided primarily for illustrating with clarity differences between the present invention and conventional structures, and should be viewed as descriptive, and not limiting in nature.

FIG. 5 shows in greater detail a preferred embodiment, macrocell 60, in accordance with the present invention. Macrocell 60 includes functionality configuration signals which are generated by configuration bits 62, polarity configuration signal, preferably generated by bit 64, a master circuit 72, a slave circuit 74, set and reset circuit 76 (shown as portions 76a, and 76b), and means, such as clock logic 78, for generating timing and control information.

Functionality configuration signals (i.e., bits 62), and the polarity configuration signal (bit 64) are the same as discussed above in the Background section. That is, configuration signals may define combinatorial and storage modes, the storage mode being further subdivided into latch and registered (D-type and T-type flip-flop) modes of operation.

Master circuit 72 includes an input coupled to input data data_in and is provided for passing data when in the combinatorial mode, and for selectively storing and passing data when in the storage mode. Master circuit includes a polarity multiplexer 80 (which itself includes transmission gate 82 and tristate inverting buffer 84), an inverter 86, and a tristate inverting buffer 88.

Polarity multiplexer 80 is responsive to a polarity configuration signal (bit 64), via clock logic 80, and provides a means for changing an output polarity of the output data of macrocell 60, shown as data_out and data_outb, between an active-high mode and an active-low mode. The polarity multiplexer 80 is illustrated as part of master circuit 72; however, other embodiments include the polarity multiplexer that is separate from master circuit 72, and before it in the signal path, and separate from both master and slave circuits 72, and 74, and after slave 74 in the signal path.

Polarity multiplexer 80 includes transmission gate 82 and tristate inverting buffer 84, and is further responsive to input data, shown in FIG. 5 as data_in, for generating a first signal. The first signal corresponds to one of either a true or complemented state of the input data data_in, all in accordance with the polarity configuration bit 64. When transmission gate 82 conducts, it will pass data_in to its output, which corresponds to a true state of the input data; conversely, when buffer 84 conducts, it will invert the input data to generate a complemented state of the input data at its output. In both the combinatorial and storage modes of operation (except for T-type flip-flop mode), only one of transmission gate 82, or tristate buffer 84 will conduct depending on the selected output polarity configuration bit 64; however, in the T-type mode, the gate selected depends on the slave circuit output. In the combinatorial mode, the selected one of the two gate will always conduct, while in the storage mode, the selected gate will conduct while the clock is low, but not while the clock is high.

More particularly, when in the latch mode, the selected one of gates 82 and 84 is on permanently (when clock is low and high). When in the registered mode, which one of the two gates will be selected (enabled) for conduction depends on whether the macrocell has been selected D-type or T-type. When the macrocell 60 is selected to operate like a D-type flip-flop, the selection of which gate (82 or 84) to enable depends on the polarity configuration. When the macrocell 60 is selected to operate like a T-type flip-flop, the selection of which gate (82 or 84) to enable depends on the output polarity, and the current state of the slave circuit 74 output (since a T-type merely "toggles" its output according to the clock).

Inverter 86 and buffer 88 provide means for storing data in response to a clock transition from low-to-high, when in the registered mode of operation. Functionally, inverter 86 always conducts. Buffer 88 never conducts when macrocell 60 is in combinatorial mode (as determined by appropriate assertion of the combinatorial configuration bit). When macrocell 60 is in the registered mode, however, buffer 88 does not conduct when the clock signal is low but will conduct when the clock goes high. In all instances, clock logic 78 determines when buffer 88 conducts.

It should be appreciated from the foregoing that master circuit 72, when macrocell 60 is in the combinatorial mode, passes the output of multiplexer 80 therethrough by way of inverter 86. It should be further appreciated that since inverter 86, and buffer 88 are connected in a feedback configuration, that one of components 82 or 84, and components 86 and 88 form a memory element to perform the above-mentioned storage or latching functions. At all times, clock logic 78 controls whether or not buffer 88 conducts.

Slave circuit 74 is provided generally for generating output data having true and complemented states and includes means, such as transmission gate 90, for selectively blocking an output of master circuit 72 according to when the clock is low. Slave circuit also includes inverter 92, and tristate inverting buffer 94. Transmission gate 90 is coupled to master circuit 72 and is provided to always pass an output of master circuit 72 when macrocell is in the combinatorial mode. When macrocell 60 is in the storage mode, transmission gate 90 is controlled to be nonconductive when the clock signal is low for blocking the output for master circuit 72, but is controlled to be conductive when the clock signal is high for passing the output of master circuit 72 therethrough. At all times, clock logic 78 controls whether transmission gate 90 is in a conductive or nonconductive mode. Slave circuit 74 further includes means, in the form of inverter 92 and buffer 94, for generating output data, shown as data_out and data_outb, having true and complemented states in both the storage, and combinatorial modes of operation. Inverter 92, and buffer 94 are connected in the feedback configuration to form, along with component 90, under certain controlling conditions, a memory element. Inverter 92 is always conducting regardless of the mode of operation. In the combinatorial mode, however, buffer 94 is controlled to be always nonconductive. When macrocell 60 is in the storage mode, and the clock signal is low, buffer 94 is conducting, thereby storing data previously transferred to it by way of the feedback arrangement. However, when the clock signal transitions high, buffer 94 is placed in a non-conductive state. At all times, clock logic 78 controls whether buffer 94 is conductive or nonconductive.

Setting and resetting means 78 is provided for setting and resetting (i.e., clearing) the output data of macrocell 60, and includes set/reset logic 96, a pullup device, such as p-channel transistor 100, a pulldown device, such as n-channel transistor 102, a pair of inverters 104, and 106, a second pullup device, such as p-channel transistor 108, and a second pulldown device, such as n-channel transistor 110. Set/reset logic 96 is responsive to, among other signals, a set, and reset signal applied thereto for generating the drive signals for transistor 100, and transistor 110 (by way of inverter 104) and transistor 102, and transistor 108 (by way of inverter 106). Block 96 is provided for disabling set and reset functions in the combinatorial mode (as indicated by the input combinatorial configuration bit). Particularly, when the combinatorial configuration bit is active, the driving outputs of block 96 are deactivated. Conversely, when one of the storage mode bits are active (e.g., d, t, or 1), then the block 96 outputs are enabled. Also, when the polarity bit 64 indicates that data_out should be complement of data_in, then clock 96 commands a "set" when the input reset signal is active, and commands a "reset" when the input set signal is active, to account for the output polarity reversal. In order to prevent gates 82, 84, 88 and 94 from competing with pullup and pulldown transistors 100, 102, 108 and 110, clock logic 78 is provided with data from block 96 to generate the appropriate signals to disable gates 82, 84, 88 and 94 whenever the set or reset signals go high (by way of signals generated by set/reset logic 96). Transistor 100, and pulldown transistor 102 are coupled to an input node of the memory element formed by inverter 86, and buffer 88 for setting or resetting the data input thereto. Similarly, pullup transistor 108, and pulldown transistor 110 are coupled to a node common between transmission gate 90 and inverter 92 to set or reset the data output therefrom.

Clock logic 78 is provided for generating timing and control information to master circuit 72, multiplexer 80, slave circuit 76, and transmission gate 90. Clock logic 80 is conventional and requires no more than the routine application of knowledge possessed by one of ordinary skill in the art, based on the description of the embodiments contained herein.

The operation of macrocell 60 will now be described in detail. In the combinatorial mode, one of either transmission gate 82, or buffer 84 is always conducting, while the other one of the two gates is always not conducting, depending on the polarity configuration bit 64. Transmission gate 90 is always conducting while tristate buffers 88, and 94 are always not conducting, regardless of the selected output polarity. Accordingly, a combinatorial path is defined through one of gates 82 or 84, gate 86, gate 90, and gate 92 (for data_out). This is the worse case combinatorial path. It should be apparent that the data output signal, data_outb, does not go through inverter 92, and thus has that much less delay.

When macrocell 60 is in the storage mode, output polarity multiplexer 80 is also used, just as in the combinatorial mode. Accordingly, when in a storage mode other than T-type flip-flop mode, either one of transmission gate 82 and buffer 84 are conducting, while the other one of these two gates is not conducting, or visa-versa, depending on the selected output polarity. In T-type flip-flop mode, again, either one of gates 82 and 84 conduct, but it is based on the slave output.

Particularly, in the latch mode, as indicated by an active 1-type bit, the selected one of 82 and 84 is permanently on (whether clock is low or high), and buffer 88 is permanently disabled. When the clock is low, gate 90 is off and buffer 94 is on (to maintain the output due to the feedback loop formed by 92 and 94). When the clock goes high, gate 90 is turned-on, while buffer 94 is turned-off, thus transferring data to slave circuit 74.

When macrocell 60 is in the registered mode, the selected one of gates 82 and 84 is turned-on when the clock is low. As mentioned above, the registered mode may include operation as a D-type flip-flop, or a T-type flip-flop. In the D-type mode, and while the clock is low, buffer 94 is conducting, while buffer 88, and transmission gate 90 are not conducting. Accordingly, while the clock is low, data_in is routed through multiplexer 80, and is applied to the input of inverter 86, which generates an output. The master circuit 72 thus maintains the data being applied to it, while slave circuit 74 is outputting data from a prior clock cycle.

When the clock signal goes high, multiplexer 80 is disabled. Further, buffer 88, and transmission gate 90 are placed in a conductive state, while buffer 94 is disabled. Accordingly, the memory element formed by inverter 86, and buffer 88 store the data input thereto, and pass it by way of transmission gate 90 to the output of macrocell 60. Thus, a transfer of data from master to slave is complete.

When the clock again falls low, among other things, transmission gate 90 is made nonconductive; however, buffer 94 is made conductive to thereby latch and maintain the data output for the duration of the low clock signal.

When operating as a T-type when in the registered mode, the selection of which gate 82 or 84 to turn-on is made as a function of the slave circuit 74 output (in addition to clock). The appropriate gate is selected to obtain an output data "toggle."

Due to the combination of the combinatorial path, and the storage path, the overall macrocell size, as compared to conventional designs, is reduced by up to 40%. Moreover, for the $T_{co}$ parameter (see Background section), a significant speed improvement, of up to 650 pico seconds, has been observed for a constructed embodiment, as compared to conventional designs. Moreover, the $T_s$ parameter (see Background section) may also be improved.

Figure 6:
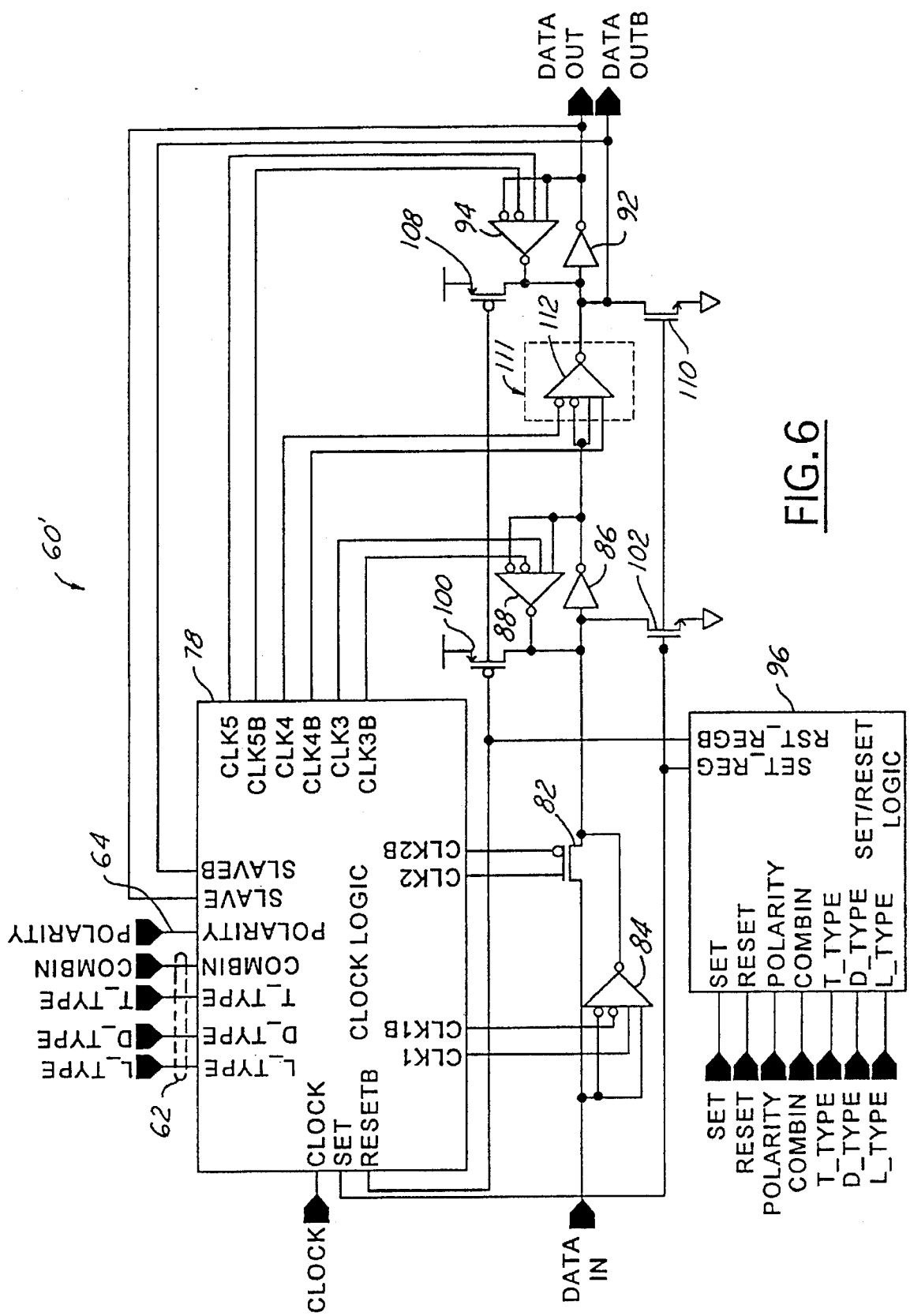
FIG. 6 is a simplified, combined, schematic and block diagram view of an alternate embodiment of the present invention, particularly showing the preferred embodiment of FIG. 5 having a tristate inverting buffer coupled to the data output for improved buffering.

Referring now to FIG. 6, an alternate macrocell embodiment 60' is depicted. Macrocell 60' is substantially identical to macrocell 60, except that transmission gate 90 has been replaced with transmission means 111, which includes a tristate inverting buffer 112. Inverting buffer 112 provides improved buffering, between a prior stage of the programmable logic device (e.g., a NOR stage) and a subsequent stage (e.g., an output buffer). This improved buffering is most usefully employed in the combinatorial mode. It should be apparent that the polarity is now inverted relative to macrocell 60, since buffer 112 inverts, while gate 90 does not. Accordingly, clock logic 78 is modified to select the opposite one of gates 82, and 84 for conduction to compensate for this change in polarity.

Figure 7:
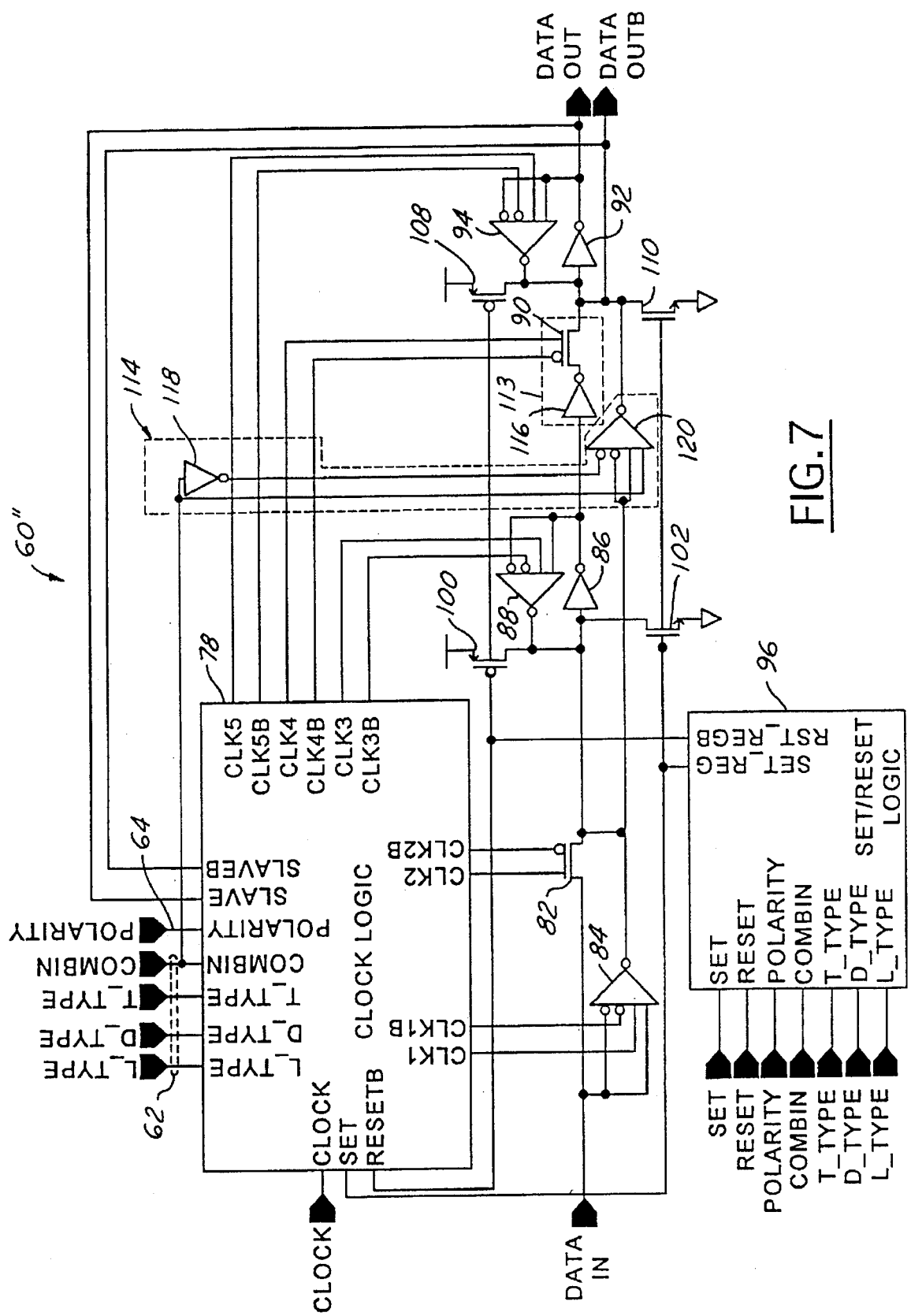
FIG. 7 is a simplified, combined, schematic and block diagram view of still another embodiment of the present invention, showing particularly a bypass structure for use when the macrocell is in the combinatorial mode.

Referring now to FIG. 7, a third macrocell embodiment 60" is depicted. Macrocell 60" is substantially identical to macrocell 60 described and illustrated above, except that macrocell 60" includes another variation of transmission means, shown particularly at transmission means 113. The macrocell 60" further includes bypass means 114 for improving output speed when macrocell is in the combinatorial mode.

Transmission means 113 includes transmission gate 90 and an inverter 116. It should be appreciated that transmission means 113 operates similarly to transmission means 111, except that the change from a tristate inverter to an inverter and a transmission gate further improves the clock-to-out delay parameter, $T_{co}$ (see Background section). The polarity through this path is the same as for macrocell 60', although still opposite from macrocell 60. Accordingly, the same modification to clock logic 78 mentioned above, relative to the clock logic 78 of macrocell 60, applies.

Bypass means 114 includes inverter 118, and tristate buffer 120. Inverter 118 is provided for, in combination with a true version of the combinatorial mode configuration bit, enabling/disabling tristate buffer 120. Data from polarity multiplexer 80 is applied to the input of buffer 120, which is operative to generate a complemented state of the output data when macrocell 60″ is in the combinatorial mode. The true state of the output signal is still generated by inverter 92, although based on the data signal deriving from buffer 120, not transmission means 113, when the macrocell is in the combinatorial mode. This embodiment thus represents, relative to the combinatorial and storage paths, common structure in the form of polarity multiplexer 80 (gate 82, and 84), and the output drivers, in the form of inverter 92.

Figure 8:
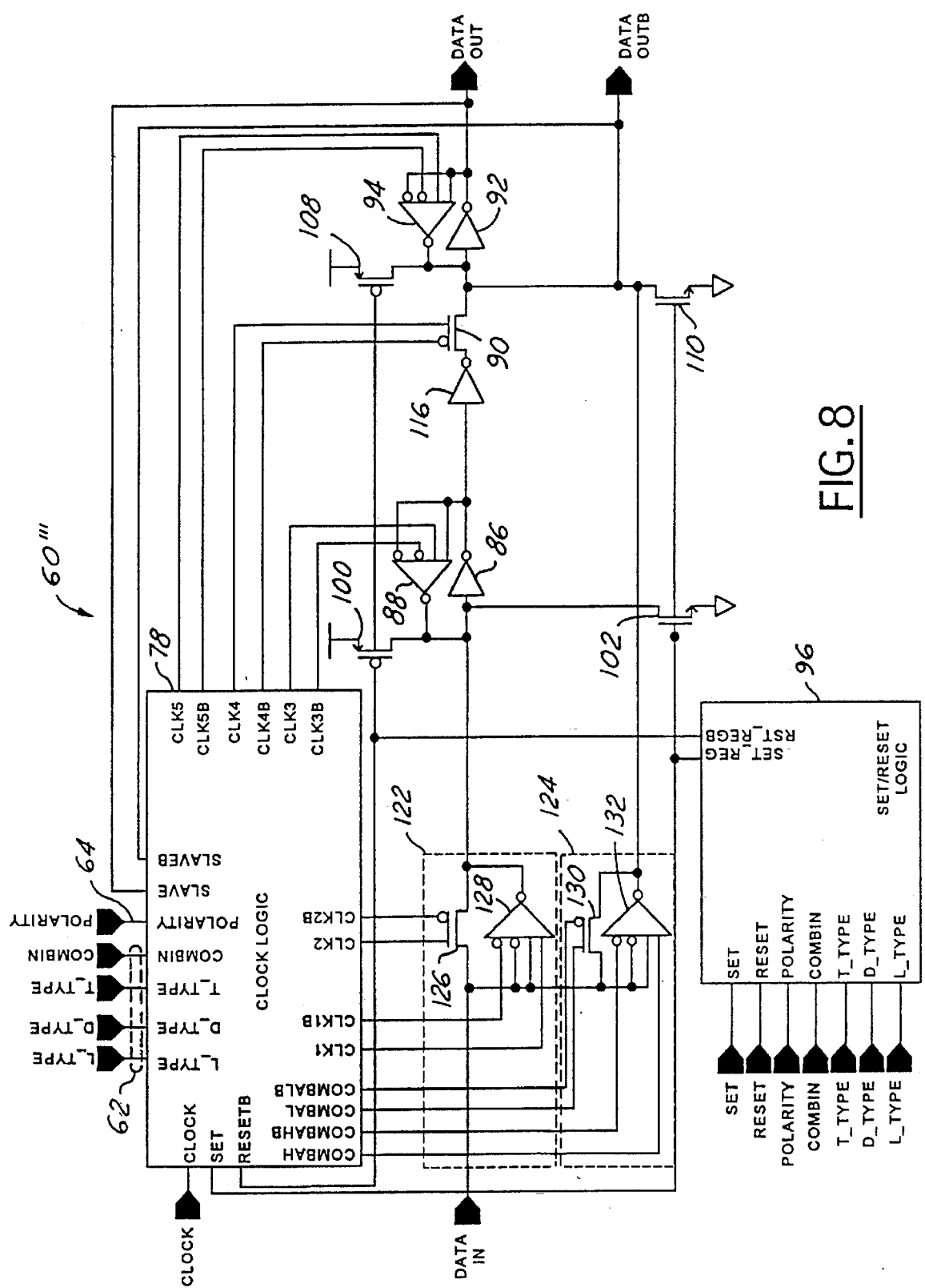
FIG. 8 is a simplified, combined, schematic and block diagram view of yet still another embodiment of the present invention, particularly showing a storage signal path, and a combinatorial signal path sharing an output driver.

Referring now to FIG. 8, a fourth macrocell embodiment 60′″ is depicted. Macrocell 60′″ is similar to the other embodiments, except that a separate output polarity multiplexer is used for each of the combinatorial, and storage paths. Particularly, macrocell 60′″ includes output polarity multiplexer 122 for use in the storage mode of operation, and an output polarity multiplexer 124 for use in the combinatorial mode of operation. Multiplexer 122 includes transmission gate 126 and tristate inverting buffer 128. Similarly, multiplexer 124 includes a transmission gate 130, and a tristate inverting buffer 132. In the storage mode of operation, the operation of macrocell 60′″ is the same as described above, with transmission gate 126 corresponding to transmission gate 82 in the other embodiments, and buffer 128 corresponding to buffer 84 in the other embodiments.

In the combinatorial mode of operation, a speed savings of additional gate delay is obtained by using the separate polarity mux 124. As before, either one of gate 130, and buffer 132 is always conducting, and the other one nonconducting, depending upon the selected output polarity configuration bit 64. Output multiplexer 124, in the combinatorial mode, directly drives the complemented output, data_outb. It should be appreciated, however, that even in the macrocell 60′″ embodiment, inverter 92 is a shared structure between the storage path, and combinatorial path, thus contributing to improved speed, and reduced area usage.

While the invention has been particularly shown and described with reference to the preferred embodiments thereof, it is well understood by those skilled in the art that various changes and modifications can be made in the invention without departing from the spirit and scope of the invention, which is limited only by the appended claims.

We claim:

1. A method of operating a macrocell, comprising the steps of:

(A) defining a combinatorial signal path through a first structure of the macrocell;

(B) defining a storage signal path through a second structure of the macrocell wherein said first structure and said second structure share one or more components selected from the group consisting of e slave circuit and a tri-state inverting buffer;

(C) selecting one of a combinatorial mode and storage mode of operation of the macrocell;

(D) operating the macrocell such that an input data signal traverses one of the combinatorial signal path and storage signal path according to the mode of operation selected in step (C) to generate an output data signal.

2. The method of claim 1 further comprising the step of:

selecting an output polarity configuration for the macrocell wherein said shared components include one or more components selected from the group consisting of an output polarity multiplexer and an inverter.

3. The method according to claim 1 wherein said shared components of said defining step comprise:

one or more components selected from the group consisting of an inverter and a tri-state buffer.

4. The method according to claim 1 wherein said shared components of said defining step comprise:

one or more components selected from the group consisting of a multiplexer and a transmission gate.

5. A macrocell for use in a programmable device, comprising:

polarity multiplexer means responsive to a polarity multiplex signal for changing a polarity of output data of said macrocell from between active high and active low;

a storage circuit coupled to said polarity multiplexer means for transmitting input data in accordance with a clock signal in a storage mode of operation;

a combinatorial circuit coupled to aid polarity multiplexer means for transmitting said input data in a combinatorial mode of operation;

wherein said storage circuit and said combinatorial circuit share one or more components selected from the group consisting of a slave circuit and a tri-state inverting buffer.

6. The macrocell of claim 5 further including means for setting and resetting said output data, said setting and resetting means including one or more pullup devices and one or more pulldown devices.

7. The macrocell of claim 6 wherein said pull devices include a p-channel transistor, and said pulldown devices include an n-channel transistor, both transistors being connected to said storage circuit and combinatorial circuit out of a storage signal path and combinatorial signal path, respectively.

8. The circuit according to claim 5 wherein said shared components of said storage circuit comprise:

one or more components selected from the group consisting of an inverter and a tri-state buffer.

9. The circuit according to claim 5 wherein said shared components of said storage circuit comprise:

one or more components selected from the group consisting of a multiplexer and a transmission gate.

10. A macrocell for use in a programmable device, comprising:

a master circuit having an input coupled to input data for passing data when in a combinatorial mode, and for selectively passing data when in a storage mode;

a slave circuit including transmission means coupled to said master circuit for selectively blocking an output of said master circuit according to a first state of a clock signal when said macrocell is in said storage mode, and for passing said master circuit output when in said combinatorial mode;

said slave circuit further including means responsive to an output of said transmission means for generating output data having true and complemented states in said storage and combinatorial modes, and for storing data during said first state of said clock signal when in said storage mode; and, a polarity multiplexer coupled to one of said master circuit and said slave circuit for varying an output polarity between active high and active low according to an output polarity signal.

11. The macrocell of claim 10 wherein said master circuit further includes means for storing data in response to a transition from said first state to a second state of said clock signal when said macrocell is in registered mode.

12. The macrocell of claim 11 wherein said storage mode includes said registered mode and a latch mode.

13. The macrocell of claim 10 further comprising:
means responsive to a set and reset signal for setting and resetting said output data.

14. The macrocell of claim 13 wherein said transmission means and said generating and storing means are connected at a common node through which a storage signal path and combinatorial signal paths are defined, said setting and resetting means including a pullup device and pulldown device respectively connected to said common node wherein said setting and resetting means are out of said storage and combinatorial signal paths to improve speed.

15. The macrocell of claim 14 wherein said storing means of said master circuit includes an input defined at an input node through which said storage and combinatorial paths are defined, said setting and resetting means further includes another pullup device and another pulldown device respectively connected to said input node.

16. The macrocell of claim 15 wherein said pullup devices include a p-channel transistor, respectively, and said pulldown devices include an n-channel transistor, respectively.

17. The macrocell of claim 13 wherein said setting and resetting means includes set and reset logic.

18. The macrocell of claim 10 further comprising clock logic responsive to said clock signal and coupled to said master circuit and said slave circuit for generating timing and control information.

19. The macrocell of claim 10 wherein said polarity multiplexer includes a transmission gate for generating said true state of said input data, and a tristate inverting buffer for generating said complemented stake of said input data.

20. The macrocell of claim 10 wherein said storing means of said master circuit includes an inverter and a tristate inverting buffer connected in a feedback configuration.

21. The macrocell of claim 10 wherein said transmission means includes a transmission gate.

22. The macrocell of claim 10 wherein said transmission means includes a tristate inverting buffer to thereby provide improved buffering.

23. The macrocell of claim 10 wherein said slave circuit includes an inverter and a tristate inverting buffer connected in a feedback configuration.

24. A macrocell for use in a programmable device, comprising:
a master circuit having an input coupled to input data for passing data when said macrocell is in a combinatorial mode, and for selectively passing data when in a storage mode;
a slave circuit including transmission means coupled to said master circuit for selectively blocking an output of said master circuit according to a first state of a clock signal when said macrocell is in said storage mode, and for passing said master circuit output when in said combinatorial mode;
said slave circuit further including means responsive to an output of said transmission means for generating output data having true and complemented states and for storing data during said first state of said clock signal, when in said storage mode, said generating and storing means of said slave circuit generating said true state of said output data when in said combinatorial mode;
a polarity multiplexer coupled to one of said master circuit and said slave circuit for varying an output polarity between active high and active low according to an output polarity signal; and,
bypass means coupled to said polarity multiplexer for generating said complemented state of said output data when in said combinatorial mode.

25. The macrocell of claim 24 wherein said master circuit further includes means for storing data in response to a transition from said first state to a second state of said clock signal when said macrocell is in a registered mode.

26. The macrocell of claim 25 wherein said storage mode includes said registered mode and a latch mode.

27. The macrocell of claim 24 wherein said bypass means includes a tristate inverting buffer.

28. A macrocell for use in a programmable device, comprising:
a master circuit including a first polarity multiplexer responsive to input data for generating a first signal in a storage mode of operation, said first signal corresponding to one of a true and complemented state of said input signal in accordance with a polarity configuration signal wherein said storage mode includes a latch mode and a registered mode;
said master circuit further including means for storing said first signal in response to a transition from a first state to a second state of a clock signal when said macrocell is in said registered mode;
a slave circuit including transmission means for selectively blocking an output of said master circuit during said first state and passing said master circuit output during said second state, when said macrocell is in said storage mode;
said slave circuit further including means responsive to an output of said transmission means for generating output data having true and complemented states of said output data and for storing said output data during said first state of said clock signal, when said macrocell is in said storage mode; and,
a second polarity multiplexer responsive to said input data for generating a second signal in a combinatorial mode of operation, said second signal corresponding to one of a true and complemented state of said input signal in accordance with said polarity configuration signal and defining said complemented state of said output data;
said slave circuit being further operative for generating said true state of said output data when in said combinatorial mode.

29. The macrocell of claim 28 further including means for setting and resetting said output data, said setting and resetting means including a pair of p-channel devices, and a pair of n-channel devices.

30. A macrocell for use in a programmable device, comprising:
polarity multiplex means responsive to a polarity multiplex signal for changing a polarity of output data of said macrocell between active high and active low;
a storage circuit coupled to said polarity multiplex means for transmitting input data in accordance with a clock signal when said macrocell is in a storage mode of operation, said storage circuit thereby defining a storage signal path;
a combinatorial circuit coupled to said polarity multiplex means for transmitting said input data when said macrocell is in a combinatorial mode of operation, said combinatorial circuit thereby defining a combinatorial signal path, said storage signal path and said combinatorial signal path having at least one common node; and,
means coupled to said storage and combinatorial circuits for setting and resetting said output data according to set and reset signals, said setting and resetting means including a pullup transistor and a pulldown transistor respectively connected to said common node wherein said setting and resetting means are out of both said storage and combinatorial signal paths.

* * * * *